United States Patent [19]

Grimes

[11] 4,232,396
[45] Nov. 4, 1980

[54] TELEVISION CHANNEL LOCK-OUT APPARATUS

[76] Inventor: Arnold S. Grimes, 7001 NW. 16th St., Apt. 413 A, Plantation, Fla. 33313

[21] Appl. No.: 924,633

[22] Filed: Jul. 14, 1978

[51] Int. Cl.³ .............................................. H04N 5/44
[52] U.S. Cl. ...................................... 455/179; 358/114
[58] Field of Search ............... 325/459, 460, 462, 464, 325/465, 467, 468, 470, 471, 453, 172, 173, 175, 395, 389; 331/76; 334/18, 21, 29; 358/114

[56] References Cited

U.S. PATENT DOCUMENTS

| 2,215,775 | 9/1940 | Banfield | 325/453 |
| 2,507,576 | 5/1950 | Reid | 325/453 |
| 2,907,876 | 10/1959 | Smith-Vaniz | 325/453 |
| 3,509,500 | 4/1970 | McNair | 325/177 |

Primary Examiner—John C. Martin
Assistant Examiner—Tommy P. Chin
Attorney, Agent, or Firm—Robert D. Farkas

[57] ABSTRACT

A television channel lock-out apparatus utilizes a plurality of individual circuits, each comprising at least one impedance element in series with a switch. The individual series of circuits are all disposed in parallel and are connected to a single switch in series therewith, and, if desired, another impedance element. The overall apparatus is disposed in parallel with any portion of a television receiver which carries the individual radio frequency signals for all of the channels handled by the television receiver, or if desired, in parallel with the local oscillator of the receiver. In operation, any one or more individual series circuit switch is closed, and when the master series switch is closed, the impedance elements disposed in electrical relationship with one another either presents a series impedance with the radio frequency signal, or shift the frequency of the local oscillator so as to preclude the receiver operating on one or more selected television channels. The remaining television channels continue to be able to be handled by the receiver by permitting the radio frequency amplifier portions of the receiver and the local oscillator portion of the receiver to function in the usual manner.

11 Claims, 2 Drawing Figures

TELEVISION CHANNEL LOCK-OUT APPARATUS

BACKGROUND OF THE INVENTION

1. The Field of the Invention

This invention relates to television receivers and apparatuses adapted to disable such receivers for use on selected channels.

2. Description of the Prior Art

The prior art abounds with scanning radio receivers or search tuning systems each possessing the characteristic of enabling the receivers to select preferred channels at the will of the user. U.S. Pat. No. 3,824,475 issued on July 16, 1974 to P. W. Pflasterer teaches a signal-seeking receiver which automatically scans a plurality of channels of respective predetermined radio frequencies lying in a multiplicity of frequency bands. The channels are tuned in successively by successively coupling respective tuning crystals into the tuning circuit of a signal generator which produces the beating signals for heterodyning. Scanning is stopped upon receiving a signal. For higher bands the frequency of a basic oscillator is multiplied by cascaded frequency-multiplying circuits. Automatic frequency control is provided for channels in the highest band, with gating means for disabling the frequency control in the absence of a received signal. For bypassing selected channels during scanning, the clock driving the scanner is speeded up when the channels to be bypassed would otherwise be tuned in.

U.S. Pat. No. 3,714,580 issued on Jan. 30, 1973 to E. F. Close discloses an electronic tuning system for a heterodyne type receiving device wherein the receiving device consists of a voltage tuned radio frequency amplifier, a voltage tuned local oscillator, a first control circuit having an output which varies as a function of the magnitude of a received signal, and a second control circuit having an output which varies as a function of the frequency of an intermediate frequency signal within the receiver. Electronic search tuning is achieved by providing a first voltage source having an output which varies as a substantially linear function of time, and supplying this output to both the radio frequency amplifier and the local oscillator during the tuning process and switching from the first voltage source to the second control circuit upon finding a sufficiently strong incoming signal.

U.S. Pat. No. 3,714,585 issued on Jan. 30, 1973 to R. C. Koch describes a multi-frequency receiver having a local oscillator with a plurality of channel determining elements sequentially connectable to control the received frequency. A shift register controlled by a multi-speed clock is used in sequencing through the channel elements. Switches are provided for each channel to control the speed of the clock. When a channel switch is set for a high speed, and as the channel determining element associated with that switch is connected to the oscillator circuit, the clock pulses rapidly again thus sequencing the receiver to the next channel determining element before the carrier sensing circuitry can lock on the channel.

All of the aforementioned patterns fail to provide an apparatus which totally precludes selectively one or more channels or a multi-frequency receiver for indefinite periods of time, controllable by a master switch, and economically fabricated so as to be includable and easily added to the circuitry of existing television receivers.

SUMMARY OF THE INVENTION

A primary object of the present invention is to provide a television receiver channel lock-out apparatus which selectively enables the user to preclude reception of television signals, both audio and video, of one or more channels, at the will of the user.

Another object of the present invention is to provide a lock-out apparatus which may be added to receivers already in existence, at an extremely low cost.

Still another object of the present invention is to provide an apparatus wherein the electronic circuitry operates totally passively, thereby failing to consume electrical energy.

Yet another object of the present invention is to provide an apparatus which may be attached to television receivers, external to the internal electronic components thereof, if desired.

A further object of the present invention is to provide a television lock-out apparatus which may be tuned without requiring sophisticated electronic equipment.

Another object of the present invention is to provide a lock-out apparatus which may be disabled utilizing a single switch.

Still another object of the present invention is to provide a receiver disabling device having a minimum of tunable elements therein.

Yet another object of the present invention is to provide a passive resonant circuit device whose basic functioning may be disabled only by those possessing a key to operate a central enabling switch.

A further object of the present invention is to provide an inexpensive, easily connected lock-out apparatus for television receivers beneficial in controlling the use of such receivers by children.

Heretofore, sophisticated, expensive and active electronic devices have been described which enable radio receivers, or television receivers, to automatically scan channels or stations at the will of the user or, if desired, automatically, so as to selectively operate the receiver on one channel or to display those channels which are effectively being used in receiving radio signals so as to indicate to the user that the channel is in use, whereby the user may automatically or manually operate the receiver on such used channels. These apparatuses, though effective in allowing a user to scan a spectrum of channels for use, fail to provide an apparatus which precludes the operation of the receiver on one or more selected channels, thereby prohibiting children from viewing channels which might be broadcasting material considered harmful or wished to be restricted from view. With the advent of television, more and more programs are being transmitted which contain matter that some adults consider harmful to children, because of their tender years. The broadcast industry has enacted a code which prohibits the broadcasting of such sensitive program content during selected hours. However, parents, or other supervisory personnel, often wish to further control certain programs received during certain periods of the day. Short of disabling the entire receiver, no known method is available to such group of parents or supervisory personnel.

The present invention contemplates this problem and provides an economical and thoroughly efficient way of resolving it by the addition of an inexpensive passive network to either the external terminals of the receiver or to certain well defined areas within the internal circuitry of the receiver. In essence, the user is permitted to operate one or more individual channel disabling switches, either singly or in combination, such that when such switches are operated, and a master which is operated, those channels desired to be maintained inoperable are effectively disabled for reception with the receiver so equipped. The master operating switch completely enables the receiver, thereby disabling the present invention from operating on any of the channels to which the individual switches have been placed into a channel disabling position. Since the apparatus is passive in nature, no power is consumed and the present invention may thus be utilized on portable receivers, designed to operate from batteries. Furthermore, because of the lack of active devices a minimum of components are utilized, thereby insuring that the present invention can be economically constructed and is reliable in nature. If desired, the present invention may be tied directly across the antenna terminal of the receiver, thereby facilitating installation by the use of untrained personnel. Factory tuning of all the key impedance elements may be accomplished so as to preclude the need for individual calibration for various channels involved. By providing factory tuned circuits possessing a significant band width, each channel disabling circuit may effectively operate over a broad portion of an individual television channel, thus effectively disabling the reception of the audio portion, as well as the video portion, of such channel. Individual isolation circuits may be employed so as to enable the user to lock out more than one channel at his will. A key-operated device, preferably in the form of a key-operated switch, enables the apparatus thereby eliminating the possibility that unauthorized personnel, such as children, may tamper with the apparatus when it is desired to preclude reception on one or more channels. Other key-operated devices, such as individual channel disabling switches, may be employed so as to prohibit unauthorized personnel from enabling a channel which is desired to be locked-out. Alternatively, the entire apparatus may be housed within an enclosure which permits access only upon the use of a key operating the cover of the enclosure. In either case, unauthorized personnel are precluded from varying the set conditions, controlled by the supervisory personnel.

These object as well as other objects of the present invention, will become more readily apparent after reading the following description of the accompanying drawings.

DESCRIPTION OF THE PREFERRED EMBODIMENT

Figure 1:
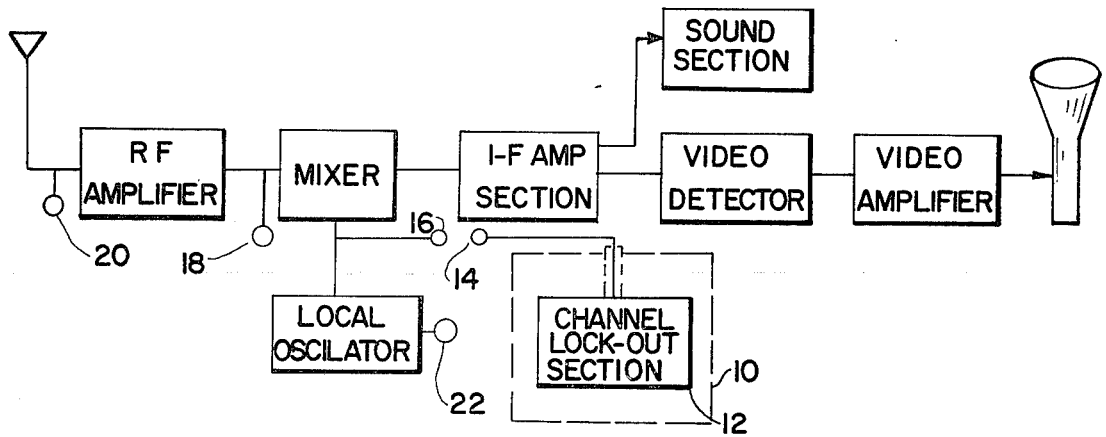
FIG. 1 is a block diagram presentation of the present invention shown in conjunction with a conventional television receiver, also presented in block diagram form.

The structure and method of fabrication of the present invention is applicable to an enclosure in which there is housed a plurality of individual electronic circuits, each having a series switch element, in series with one or more impedance elements. Each of the individual series elements may be operated in conjunction with one or more series impedance elements. Such individual series circuits, comprise an individual channel lock-out circuit. Their series impedance elements, if any, are utilized isolate one or more such series circuits from an adjacent series circuit. All individual series circuits and their series impedance element, if any, are disposed in electrical parallel arrangement with one another. The parallel array has one terminal thereof disposed in series with a master switch circuit which in turn may be disposed in series with a series impedance element. Thus, the free terminal of the master series impedance element and the other terminal of the parallel array circuit define a circuit wherein when the master series switch is closed, and when one or more of the individual channel disabling switches are closed, such individual series circuits disable a channel because the total impedance presented by the overall circuit is provided having a series of nulls, each such null representing an extremely low impedance for the channel or channels which are desired to be disabled. This is accomplished by arranging all of the series impedances, exclusive of series resistances, so as to make each individual series circuit, in combination with a main series impedance element, resonate at a frequency which will ultimately disable the receiver from effectively operating on a given channel. The overall apparatus is connected to portions of the receiver which handle either radio frequencies or the terminals of the local oscillator. If it is desired to disable the radio frequency carrying capabilities of the receiver, each individual series resonant circuit combination is tuned to cover the band width of the channel desired to be disabled. Such terminals of the overall apparatus may be connected to the antenna terminals of the receiver, or to shunt some vital RF handling portion of the tuner portion of the receiver, such as across the input or output terminals of an RF amplifier stage. Alternately, the apparatus may be coupled to the local oscillator, either directly across same, or if desired, across the mixer input terminals of the receiver. In such location, the present invention operates so as to disable the oscillator, either by detuning same, or by effectively shunting the mixer input signal from same so as to preclude the generation of intermediate frequency signals for those channels which are desired to be disabled.

Each individual circuit comprising the individual series circuits may utilize a variable inductance along, a fixed inductance alone, a fixed inductance in parallel with a fixed capacitance, a fixed inductance in parallel with a variable capacitance, a variable capacitance in parallel with a fixed inductance, or any of these in series or in parallel with a band width adjusting resistor. The function of such resistor is to control the Q of the tuned circuit in which the series impedance elements, aforementioned, are involved. Such impedance elements, either in parallel or in series, operate with a major central impedance element so as to make up the desired resonant frequency for each individual series trap circuit, in a series trap design. A series circuit is selected so as to represent an extremely low impedance when it is desired to shunt radio frequency signals. Obviously, the same effect may be achieved by adding a plurality of capacitors or resistors selectively in parallel with a local oscillator so as to detune same. The master series operating switch also controls the operation of each of all of the individual series circuits by disabling all of them upon the opening of such switch. Series impedance elements, disposed in series with each of the individual series circuits, act so as to isolate such individual series circuit from one another thereby enabling, in a manner well known to the art, more than one series circuit to be disposed in parallel relationship with each other without effectively disabling the low impedance nulls produced by each series impedance circuit. In this fashion, more than one individual series circuit may be enabled so as to preclude the operation of more than one channel at the same time.

The individual series circuit switches, as well as the main series circuit switch, may be key operated if desired, so as to enable the user to individually control the operation of individual channels, and to disable the disabling apparatus comprising the present invention, at times determined by the user possessing the use of such keys. Alternatively, the entire apparatus may be housed within an enclosure wherein each of the switches are manually operated without keys but contained within the enclosure such that one key precludes the usable access of any of the switches aforementioned. Active elements may be employed, if desired, but are deemed unnecessary.

Now referring to the figures, and more particularly to the embodiment illustrated in FIG. 1 showing in dotted lines 10 the present invention depicted by block 12 terminating in terminal 14. The remaining blocks of FIG. 1 describe certain elements of a conventional television receiver of the super heterodyne variety. It should be specifically understood that the present invention may be utilized with any type of receiver, regardless of the frequency used, the class of service in which it is placed, and the number of channels which are to be controlled thereby. Terminal 16 is shown connected at the intersection of the local oscillator and mixer stages of the television receiver. Terminal 18 is shown connected in between the radio frequency amplifier stage and the mixer stage of the television receiver. Terminal 20 represents the terminal of the antenna portion of the television receiver. When terminal 14 is either connected to terminal 16, 18 or 20, present invention 12 is a functional node, dependent upon the frequency of tuning of the various elements, not shown, contained therein. Terminal 22, representing a tuned circuit operating the local oscillator, may also be employed, if desired, to the same effect.

Figure 2:
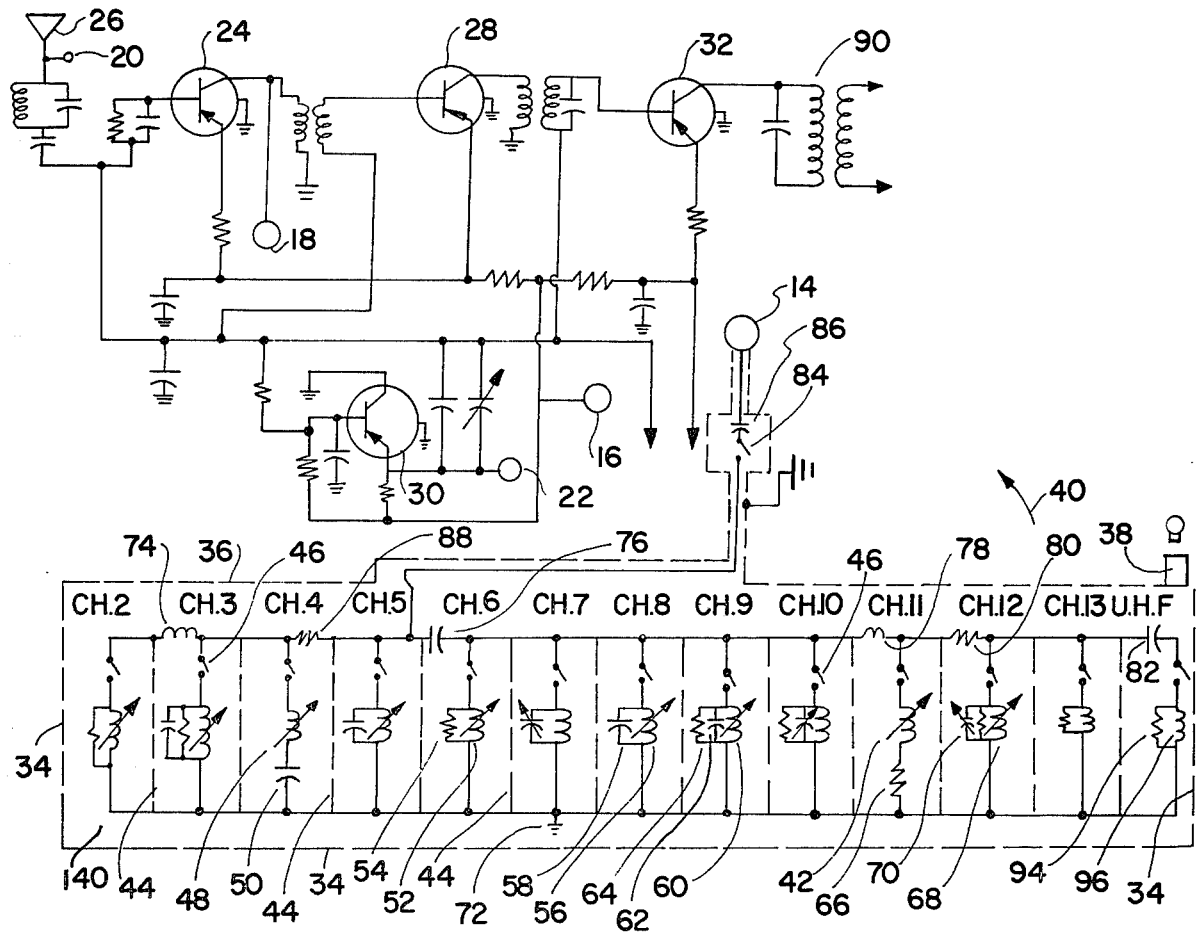
FIG. 2 is a schematic representation of the electronic components making up the present invention, shown in conjunction with the electronic components making up a portion of a television or radio receiver.

FIG. 2 illustrates transistor 24 operated by antenna 26, and carrying all the radio frequency signals detected by antenna 26. Transistor 28 represents the mixer stage of the television receiver, shown in FIG. 1. Transistor 30 represents the local oscillator stage of the local oscillator shown in FIG. 1. Transistor 32 represents an IF amplifier, shown in FIG. 1. Terminal 20 is utilized in conjunction with any ground terminal shown. Terminal 18 is likewise used in conjunction with any ground terminal shown as are terminals 16 and 22. Terminal 14 is shown unconnected to any of terminals 16, 18, 20, or 22 but is adapted for hard-wire coupling thereto at the will of the user. Dotted lines 34, represent an enclosure covered by dotted lines 36, acting as a lid. Key-operated lock 38 permits dotted lines 36 to be disposed in the direction of arrow 40, thereby providing access to the interior of cavity 140 enclosed thereby. Dotted lines 44 are shown separating various electronic components depicted by the notation CH. 2, 3, 4 . . . 13. One such compartment is described by the letters U.H.F. Such dotted lines either depict shielding, separating adjacent electrical elements from one another or are simply used to define individual series circuits comprising individual channel disabling switches 46. In general, individual channel disabling switches 46 are shown in a series circuit with at least one impedance element. Such at least one impedance element is always reactive in nature, such as inductance 48, shown variable in nature, or capacitor 50 shown fixed in nature. Alternatively, adjustable inductance 52, may be disposed in parallel with band width adjusting resistor 54, inductor 56, of the variable variety, is shown disposed in parallel with capacitor 58. Another series reactor circuit utilizes variable inductance 60 in parallel with fixed capacitance 62, both being in parallel with fixed resistor 64. Series elements, resistive or reactive in nature may be employed, such as capacitor 50 or resistor 66. Two or more reactive elements, such as inductor 68 and capacitor 70, may both be variable, as desired. In any event, all of such series circuits, have one terminal thereof coupled together and connected to ground terminal 72. Series impedance elements, such as inductor 74, capacitor 76, inductor 78, resistor 80 or capacitor 82 may be employed in series with each of the individual series circuits. Master switch 84 is shown in series with master series impedance element 86 shown represented as a capacitor. It should be specifically understood that series impedance element 86, if one is employed, may be an inductor or a series combination of an inductor and a capacitor, to which one or more resistors may be coupled so as to adequately adjust the overall band width of the apparatus as desired.

In use, terminal 14 may be coupled to terminal 20 by a hard-wire connection. Switch 84 may be individual key operated, as switches 46 may be. Alternatively, lock 38 may be employed, if desired. When terminal 14 is coupled to terminal 20, impedance elements 48 and 50, in combination with impedance element 86 are tuned to operate at the frequency on which channel 4 in the standard television broadcast range operates. It is presumed, in such an arrangement that all the Q's of the entire resonant circuit comprising elements 86, 50 and 48, and resistor 88 is sufficiently low so as to either resonate over the width of the video spectrum of such channel, or the audio spectrum of such channel, or both, as desired. When switch 84 and switch 46, shown in series with variable inductor 48, are both closed, such series resonant circuit precludes the admission of radio frequency signals into transistor 24, by reason of being shorted out at terminal 20.

In the event that terminal 14 is coupled to terminal 18, the same tuning arrangement must be effected, since terminal 18 also carries radio frequency signals on all the same frequencies present at terminal 20.

If terminal 14 is coupled with terminal 16, the terminal representing the input to mixer transistor 28, then the series circuit comprising reactive elements 86, 48 and 50 must be tuned to represent the local oscillator frequency, generated by local oscillator stage 30, so as to preclude the admission of such operating frequency into the mixer stage.

If terminal 14 is coupled to terminal 22, then reactive elements 86, 48 and 50 must be arranged so as to resonate at some frequency which would detune oscillator stage 30 so that it will oscillate at a frequency other than the correct local oscillator frequency for which transformer 90 is tuned thereby precluding the admission of intermediate frequency signals into intermediate frequency stage represented by numeral 32.

Alternatively, reactive elements 56, 58 and 84 may be combined to represent the desired series resonant circuit as required for precluding the effective operation of channel 8. Again alternatively, single impedance element, depicted by inductance 40, operating in conjunction with band width adjusting resistor 66, may be utilized in combination with series capacitance 86 so as to preclude the effective operation of channel 11 in like fashion.

Capacitor 86, if desired, may be of such magnitude that it does not affect the tuning characteristics of any of the individual series circuits, such as in the case of variable inductance 60, fixed capacitor 62 and band width adjusting resistor 64.

Capacitor 76 may be utilized for series resonant circuit isolation purposes, similar to inductance 74 or 78, or, if desired, similar to capacitor 82. Alternatively, series capacitor 76 may be utilized to offset the general tuning arrangement of all of the individual circuits whose frequencies are higher than channel 5, such as determined by the normal void in the operating frequencies between channel 5 and channel 6 in the approved band width use of the television channels, Capacitor 82, as shown, may also be utilized for the same purpose. Band width adjusting resistor 94 may be utilized to control the band width of inductor 96 so as to disable all of the U.H.F. channels at one time, if desired. It should be understood that more than one U.H.F. channel series circuit, comprising a series switch element and a selection of impedance elements may be utilized in selective disabling of one or more of the various U.H.F. channels.

If desired, series switch element 84, as well as series impedance element 86, may be disposed of, such that each individual series circuit may operate only upon the manual manipulation of individual channel disabling switches 46. If this be the case, each channel is disabled or enabled upon the operation of an individual switch alone, without having the benefit of a master enabling or disabling switch.

One of the advantages of the present invention is a television receiver channel lock-out apparatus which selectively enables the user to preclude reception of television signals, both audio and video, of one or more channels, at the will of the user.

Another advantage of the present invention is a lock-out apparatus which may be added to receivers already in existence, at an extremely low cost.

Still another advantage of the present invention is an apparatus wherein the electronic circuitry operates totally passively, thereby failing to consume electrical energy.

Yet another advantage of the present invention is an apparatus which may be attached to television receivers, external to the internal electronic components thereof, if desired.

A further advantage of the present invention is a television lock-out apparatus which may be tuned without requiring sophisticated electronic equipment.

Another advantage of the present invention is a lock-out apparatus which may be disabled utilizing a single switch.

Still another advantage of the present invention is a receiver disabling device having a minimum of tunable elements therein.

Yet another advantage of the present invention is a passive resonant circuit device whose basic functioning may be disabled only by those possessing a key to operate a central enabling switch.

A further advantage of the present invention is an inexpensive, easily connected lock-out apparatus for television receivers beneficial in controlling the use of such receivers by children.

Thus, there is disclosed in the above description and in the drawings, an embodiment of the invention which fully and effectively accomplishes the objects thereof. However, it will become apparent to those skilled in the art, how to make variations and modifications to the instant invention. Therefore, this invention is to be limited, not by the specific disclosure herein, but only by the appending claims.

I claim:

1. A television channel lock-out apparatus comprising a plurality of individual series circuits, each of said plurality of individual series circuits having at least one reactive element in series with an individual switch element, said individual series circuits having one end thereof coupled together, said individual switch element selectively coupling the other end of said individual series circuits together to one end of a parallel electrical circuit, said one end of said individual series circuits coupled to the other end of said parallel circuit, said parallel electrical circuit having said at least one reactive element coupled to one of a plurality of selected portions of a multi-channel television receiver circuit and a ground terminal thereof, said plurality of selected portions including a signal antenna terminal, a radio frequency amplifier terminal, a mixer input terminal and a local oscillator terminal of said receiver circuit, means for enabling said individual series circuits to be independently, selectively and concurrently coupled to said selected portion of said television receiver circuit so that said television receiver has a selected number of the otherwise operable channels which are thereby rendered inoperable.

2. The apparatus as claimed in claim 1 further comprising a master switch being disposed coupled in series with said parallel circuit.

3. The apparatus as claimed in claim 1 further comprising a housing, said housing carrying a lock, said lock controlling access to the interior of said housing, each said switch element carried within said housing.

4. The apparatus as claimed in claim 2 wherein said master switch is disposed within a housing.

5. The apparatus as claimed in claim 1 wherein each said switch element is key operated.

6. The apparatus as claimed in claim 2 wherein said master operated switch is key operated.

7. The apparatus as claimed in claim 1 further comprising a master series reactive element, said master series reactive element disposed in series with said parallel circuit.

8. The apparatus as claimed in claim 1 further comprising an isolating impedance element, said isolating impedance element being disposed coupled to and intermediate two of said individual series circuits.

9. The apparatus as claimed in claim 1 wherein said at least one reactive element is utilized in a series resonant circuit, said series resonant circuit being disposed selectively tuned to a radio frequency precluding the operation of said television receiver when said radio frequency is introduced into the antenna circuit of said television receiver.

10. The apparatus as claimed in claim 1 wherein said at least one reactive element is tuned to an operating frequency of said local oscillator of said television receiver.

11. The apparatus as claimed in claim 1 wherein said at least one reactive element is operated at resonance when disposed in parallel with the output terminals of said local oscillator and resonantly detunes said local oscillator from an operating frequency thereof in which said local oscillator produces signals equal selectively to the sum and difference of the radio frequency signal operating said television receiver and the resonant frequency of the intermediate frequency amplifier of said receiver.

* * * * *